(12) United States Patent
Tsai (10) Patent No.: US 7,121,863 B2
(45) Date of Patent: Oct. 17, 2006

(54) CHIP CONNECTOR THAT CAN BE IN SLIDING CONTACT WITH A CHIP

(76) Inventor: Chou Hsuan Tsai, 15F, No. 4, Lane 127, Sec. 1, Fu-Hsiang Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 11/110,455

(22) Filed: Apr. 19, 2005

(65) Prior Publication Data
US 2005/0245119 A1 Nov. 3, 2005

(51) Int. Cl.
*H01R 13/62* (2006.01)
(52) U.S. Cl. .......................................... 439/331; 439/71
(58) Field of Classification Search ........ 439/328–331, 439/487, 485, 70–73, 525–526, 91, 178, 439/876, 591, 630, 68
See application file for complete search history.

(56) References Cited

U.S. PATENT DOCUMENTS

| | | | | |
|---|---|---|---|---|
| 4,345,810 A | * | 8/1982 | Bakermans | 439/71 |
| 5,344,334 A | * | 9/1994 | Laub et al. | 439/331 |
| 5,761,036 A | * | 6/1998 | Hopfer et al. | 361/704 |
| 6,644,981 B1 | * | 11/2003 | Choy | 439/70 |
| 6,877,993 B1 | * | 4/2005 | Palaniappa et al. | 439/73 |

* cited by examiner

*Primary Examiner*—P. Austin Bradley
*Assistant Examiner*—Edwin A. Leon
(74) *Attorney, Agent, or Firm*—Pro-Techtor Int'l Services (57) ABSTRACT

A chip connector to be electrically connected to a chip. The chip connector includes an inner seat, terminals and an outer seat. The inner seat is formed with a plurality of terminal slots and a placement area in which the chip is placed. The terminals are respectively disposed in the terminal slots. Each terminal has an elastic arm, which has a connection point to be electrically connected to the chip. The outer seat has a bottom surface, a circumferential wall for enclosing the inner seat, a front end formed with a stationary pressing board for pressing a front end of the chip longitudinally, and two elastic arm portions extending backwards and formed at two sides of the outer seat. The elastic arm portions press the chip longitudinally and are elastically moved laterally to part from the chip.

10 Claims, 9 Drawing Sheets

CHIP CONNECTOR THAT CAN BE IN SLIDING CONTACT WITH A CHIP

BACKGROUND OF THE INVENTION

1. Field of the Invention

The invention relates to an electrical connector, and more particularly to a chip connector that can be in sliding contact with a chip.

2. Description of the Related Art

In the prior art, the bottom surface of a chip (e.g., a CPU) is formed with a plurality of connection points spaced apart from one another. In an electrical connector for connecting to this type of chip, a downward pressing force is applied to fix the chip to a base such that the connection points of the chip and terminals in terminal slots of the base are in elastic contact with each other and the electrical connection effect may be ensured.

Figure 1:
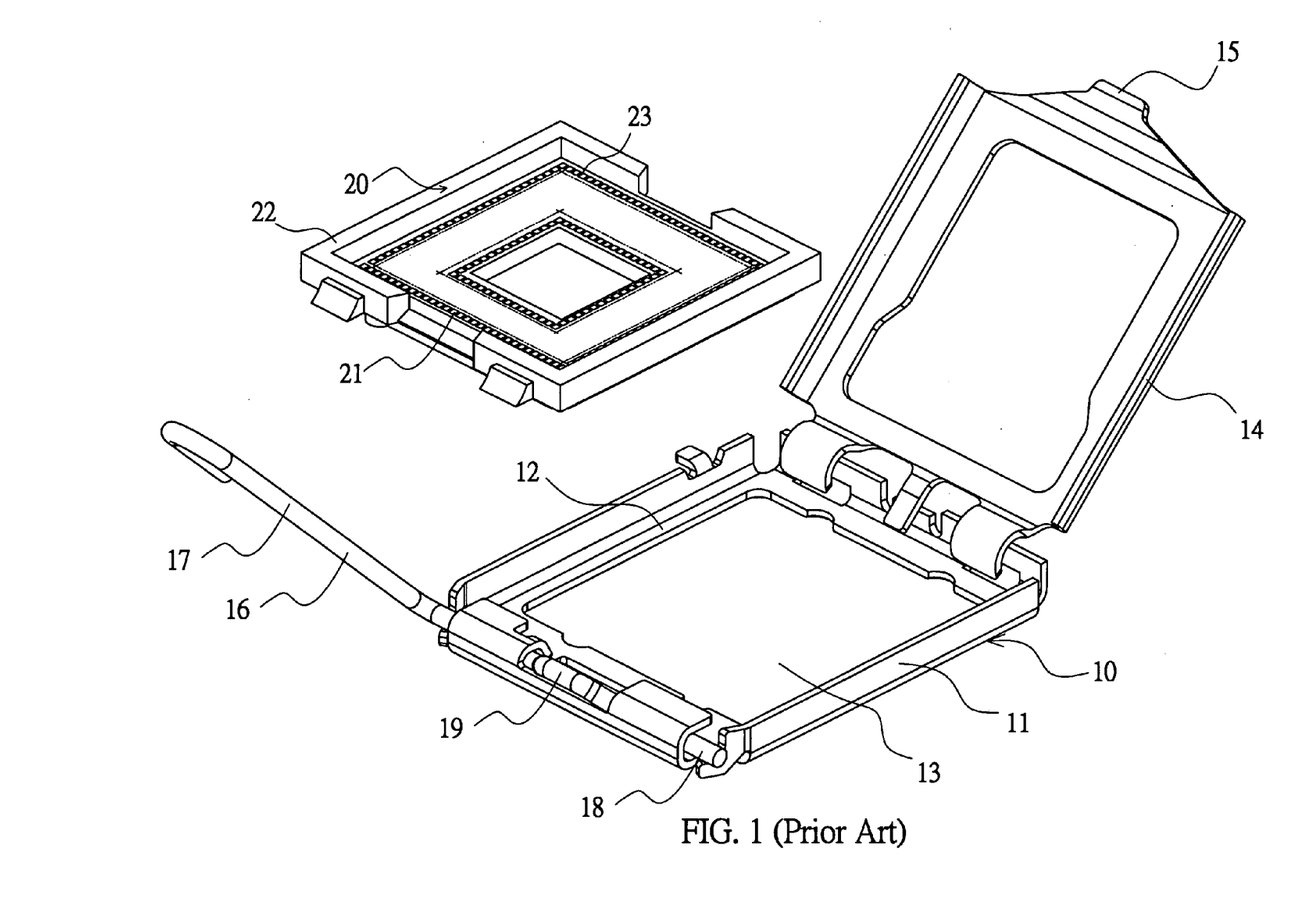
FIG. 1 is a pictorially exploded view showing a conventional chip connector.

Referring to FIG. 1, a conventional chip connector includes an outer seat 10, an inner seat 20 and a plurality of terminals 25.

The outer seat 10 made of the metal material includes a base 11, an upper cover 14 and a lever 16. The base 11 has a bottom surface 12 formed with an opening 13 at the middle portion thereof. The upper cover 14 has one end pivoted on one end of the base 11, and the other end formed with a flange 15. The lever 16 includes a first rod 17 and a second rod 18. The second rod 18 is pivoted on the other end of the base 11 and is formed with a curved portion 19.

The inner seat 20 made of the plastic material is disposed in the outer seat 10 and is formed with a plurality of terminal slots 21. The periphery of the top of the inner seat 20 is formed with a flange 22 extending upwards to enclose a placement area 23 in which a chip may be placed.

Figure 2:
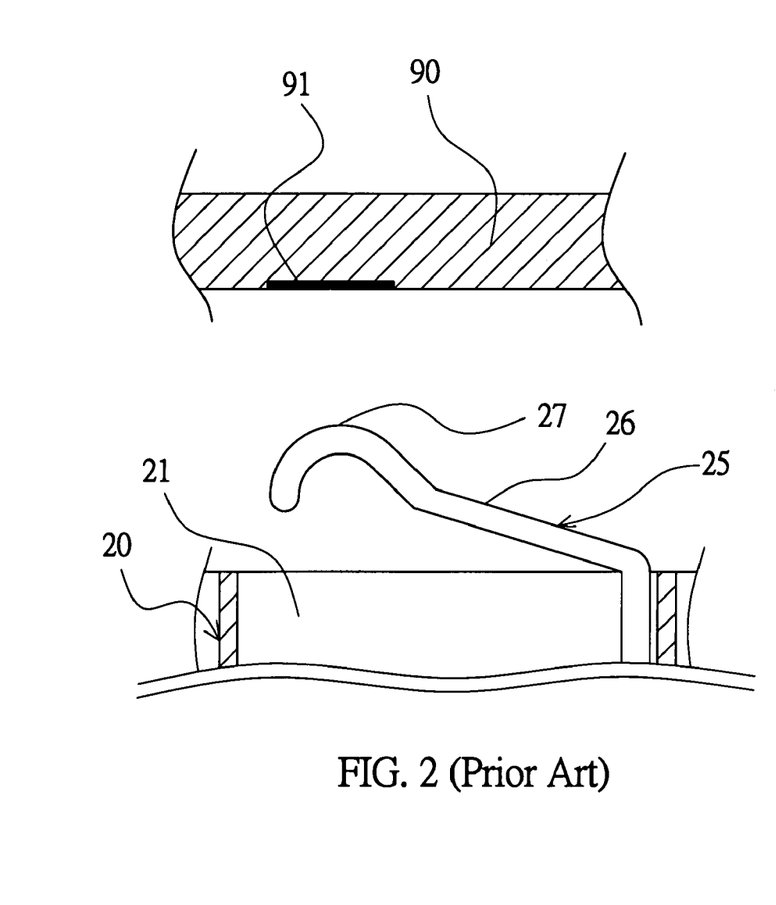
FIG. 2 is a schematically cross-sectional view showing the conventional chip connector that is not connected to a chip.
Figure 3:
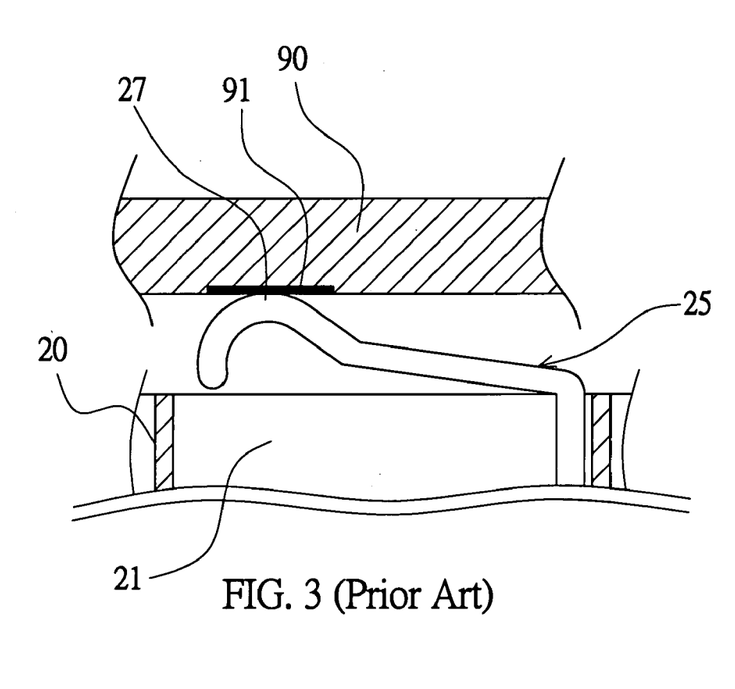
FIG. 3 is a schematically cross-sectional view showing the conventional chip connector that is connected to the chip.

As shown in FIGS. 2 and 3, the terminals 25 are respectively disposed in the terminal slots 21 of the inner seat 20. Each terminal 25 has an elastic arm 26 formed with a convex connection point 27 to be electrically connected to a connection point 91 on the bottom surface of the chip 90.

Figure 4:
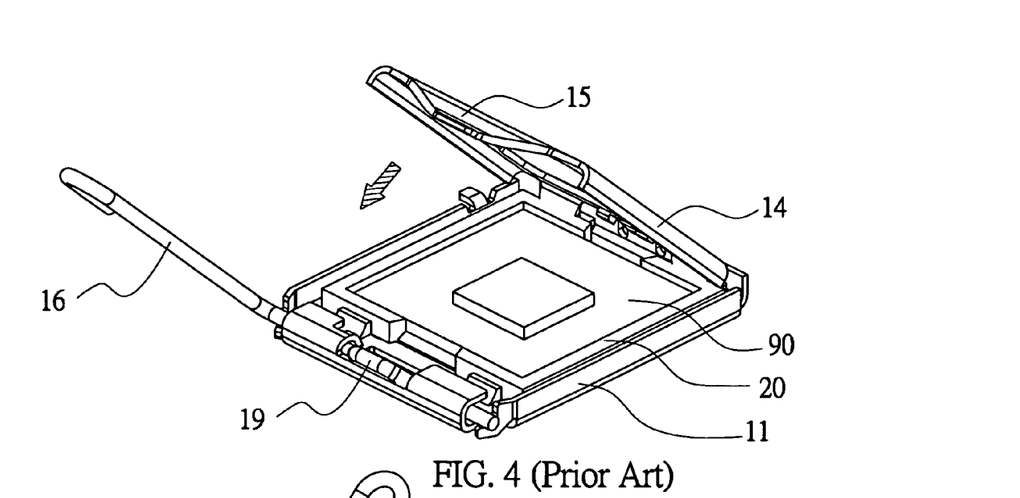
FIGS. 4 to 6 are pictorial views showing usage states of the conventional chip connector.
Figure 5:
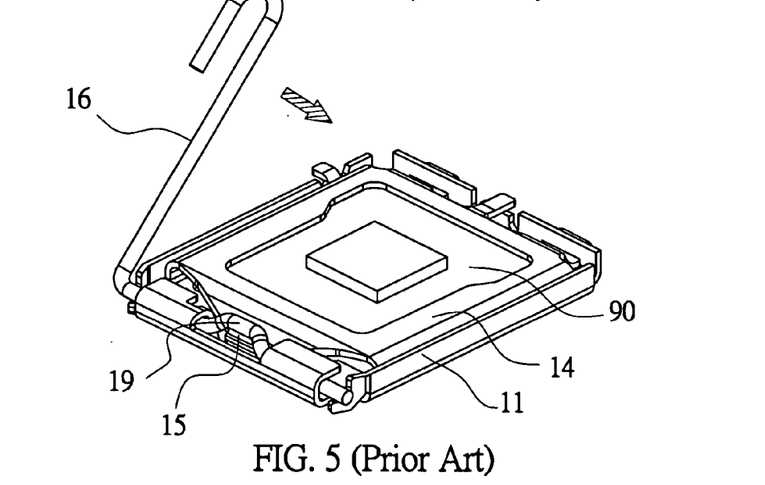
Figure 6:
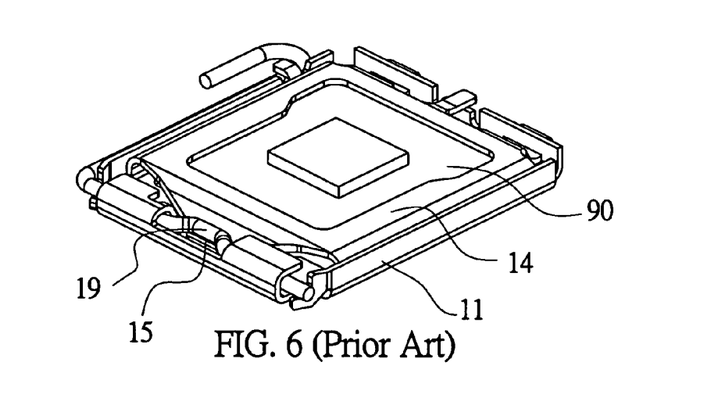

When a chip is mounted in the chip connector, as shown in FIG. 4, the chip 90 is placed in the inner seat 20 and then the upper cover 14 is closed. Then, as shown in FIG. 5, the lever 16 is rotated rightwards and pressed down. As shown in FIG. 6, the curved portion 19 of the lever 16 is pressed down to fix the flange 15 of the upper cover 14. Thus, a downward pressing force is provided to press the chip 90 such that the terminals 25 are elastically pressed down, as shown in FIG. 3. At this time, the connection point 27 of the terminal elastically presses the connection point 91 of the chip to achieve the electrical connection effect.

The prior art has the following drawbacks.

1. The structure is complicated because the upper cover 14 has to cover the chip 90 and then the lever 16 has to press the upper cover 14. Thus, the outer seat 10 has three members including the base 11, the upper cover 14 and the lever 16, and the manufacturing cost cannot be effectively reduced.

2. The operation is complicated because the user has to use one hand to press the chip 90 and the other hand to rotate the lever 16 to fix the chip 90.

3. As shown in FIGS. 2 and 3, the chip 90 is horizontally placed into the placement area 23 of the inner seat 20. When the chip 90 is pressed downwards, the terminal 25 only moves vertically and the chip 90 has no displacement. So, the connection point 27 of the terminal and the connection point 91 of the chip have no sliding contact therebetween, and the oxide layers of the connection points cannot be scraped off. If the oxide layers can be scraped off, a better electrical connection effect can be obtained.

SUMMARY OF THE INVENTION

It is therefore an object of the invention to provide a chip connector having a simple structure and the advantages of decreasing the manufacturing cost and simplifying the operation procedures.

Another object of the invention is to provide a chip connector capable of scraping the oxide layers of the connector and the chip when the electrical connection is established therebetween.

To achieve the above-mentioned objects, the invention provides a chip connector to be electrically connected to a chip. The chip connector includes an inner seat, a plurality of terminals and an outer seat. The inner seat is formed with a plurality of terminal slots spaced apart from one another. The inner seat has a top formed with a placement area in which the chip is placed. The terminals are respectively disposed in the terminal slots of the inner seat. Each of the terminals has an elastic arm, which has a connection point to be electrically connected to the chip. The outer seat has a bottom surface, a circumferential wall for enclosing the inner seat, a front end formed with a stationary pressing board for pressing a front end of the chip longitudinally, and two elastic arm portions extending backwards and formed at two sides of the outer seat. The elastic arm portions press the chip longitudinally and are elastically moved laterally to part from the chip.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 7:
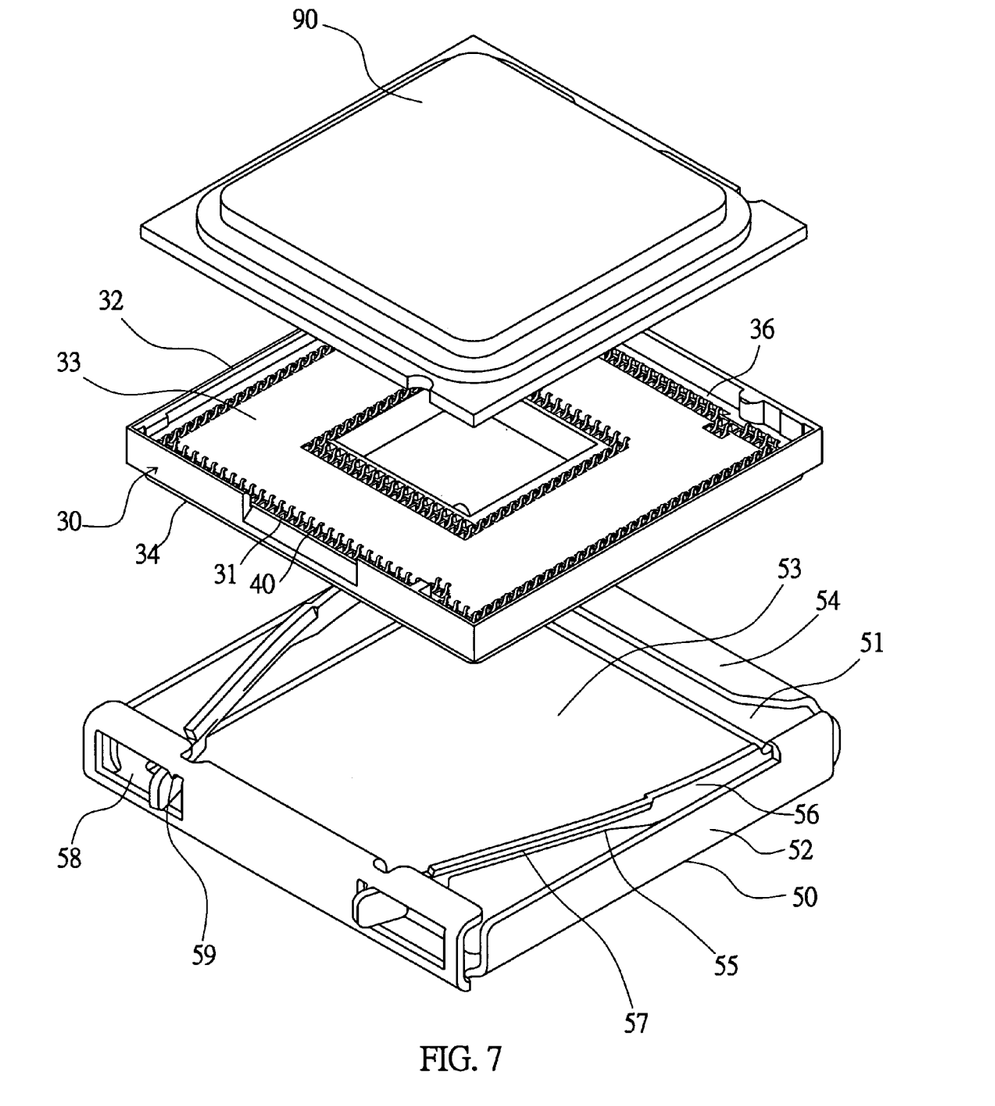
FIG. 7 is a pictorially exploded view showing a chip connector according to a first embodiment of the invention.
Figure 8:
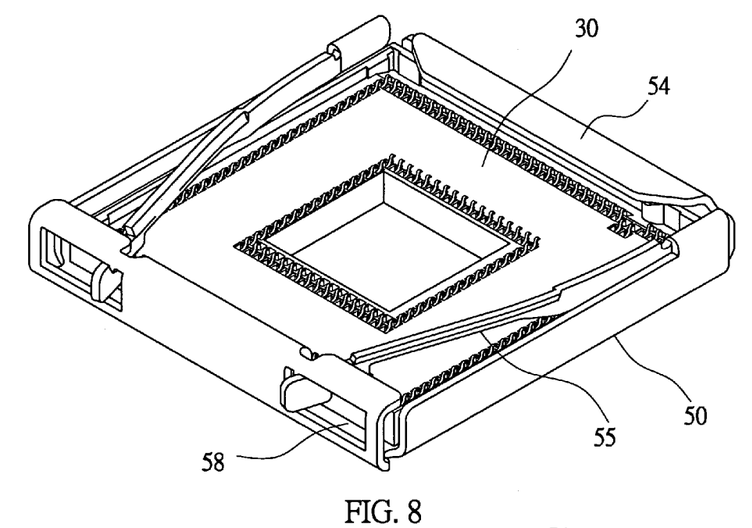
FIG. 8 is a pictorially assembled view showing the chip connector according to the first embodiment of the invention.
Figure 9:
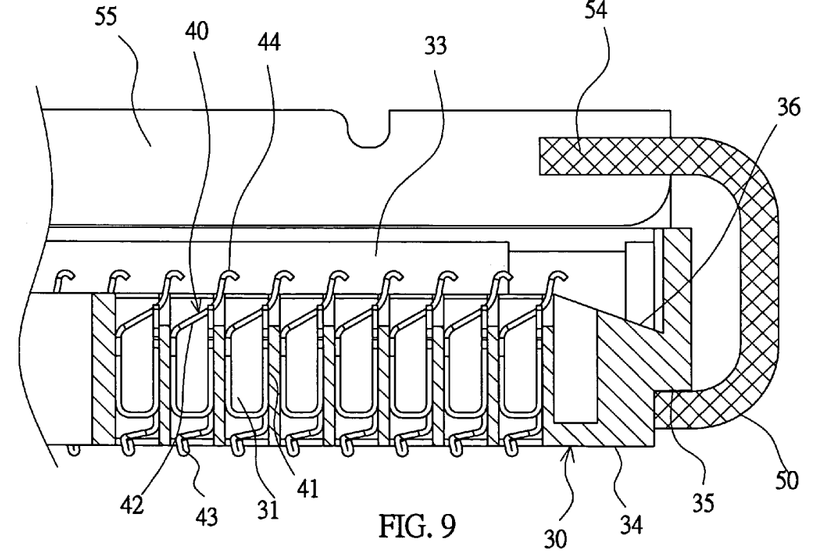
FIG. 9 is a cross-sectional side view showing the chip connector according to the first embodiment of the invention.

As shown in FIGS. 7 to 9, an electrical connector of this embodiment is to be electrically connected to a chip 90 and includes an inner seat 30, a plurality of terminals 40 and an outer seat 50.

The inner seat 30 made of a plastic material is formed by way of injection molding. A plurality of terminal slots 31 spaced apart from one another is formed in the inner seat 30. A flange 32 enclosing a placement area 33, on which the chip 90 may be placed, is formed on a periphery of a top of the inner seat 30. A bottom middle portion 34 of the inner seat 30 is a convex portion such that the periphery of the middle portion 34 is formed with a concave portion 35. A concave bevel slot 36 is formed at a front end of the placement area 33 so that the chip 90 can be easily placed into the placement area 33 slantingly.

The terminals 40 are respectively disposed in the terminal slots 31 of the inner seat 30. Each terminal 40 has a fixing portion 41, an elastic arm 42 and a pin 43. The fixing portion 41 is clamped and fixed by the terminal slot 31. The elastic arm 42 is connected to a bottom end of the fixing portion 41 and extends upwards. A connection point 44 extending toward the placement area 33 is formed near a distal end of the elastic arm 42. The pin 43 extends out of the terminal slot 31.

The outer seat 50 made of a metal material is formed by way of pressing. The outer seat has a bottom surface 51 and a circumferential wall 52 for enclosing the inner seat 30. The middle of the bottom surface 51 is formed with an opening 53 corresponding to the terminal slots 31 of the inner seat. The bottom middle portion 34 of the inner seat 30 penetrates through the opening 53, and the concave portion 35 of the inner seat is engaged with the bottom surface 51 of the outer seat 50. Then, the high-frequency wave is used to fix the inner seat 30 and the outer seat 50 together. A stationary pressing board 54 is formed on a top of the front end of the outer seat 50. Two elastic arm portions 55 extending backwards are respectively formed at two sides of the outer seat 50. The elastic arm portion 55 has a board surface that slightly tilts outwards. Also, the elastic arm portion 55 has a front section 56 and a rear section 57. The front sections 56 are connected to an upper edge of the front end of the circumferential wall 52 at two sides of the outer seat 50 and are then bent downward. The rear section 57 and the front section 56 define an angle to make the rear section 57 extend into the inner seat 30 in a slantingly manner. A longitudinal through hole 58 is formed at each of the two sides of the rear portion of the circumferential wall. The rear ends of the elastic arm portions 55 pass through the through holes 58, respectively, in order to restrict the elastic arm portions 55 in the lateral movement in the through holes 58 without the upward movements. In addition, a stopping projection 59 for preventing the outward movement of the elastic arm portion 55 is formed in the through hole 58.

Figure 10:
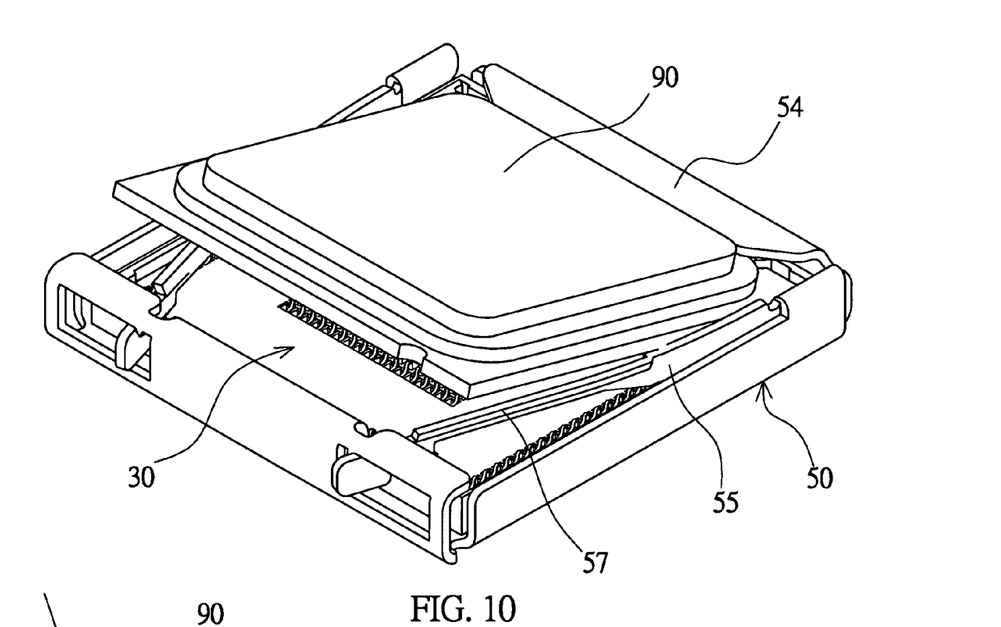
FIG. 10 is a pictorial view showing a usage state according to the first embodiment of the invention.
Figure 11:
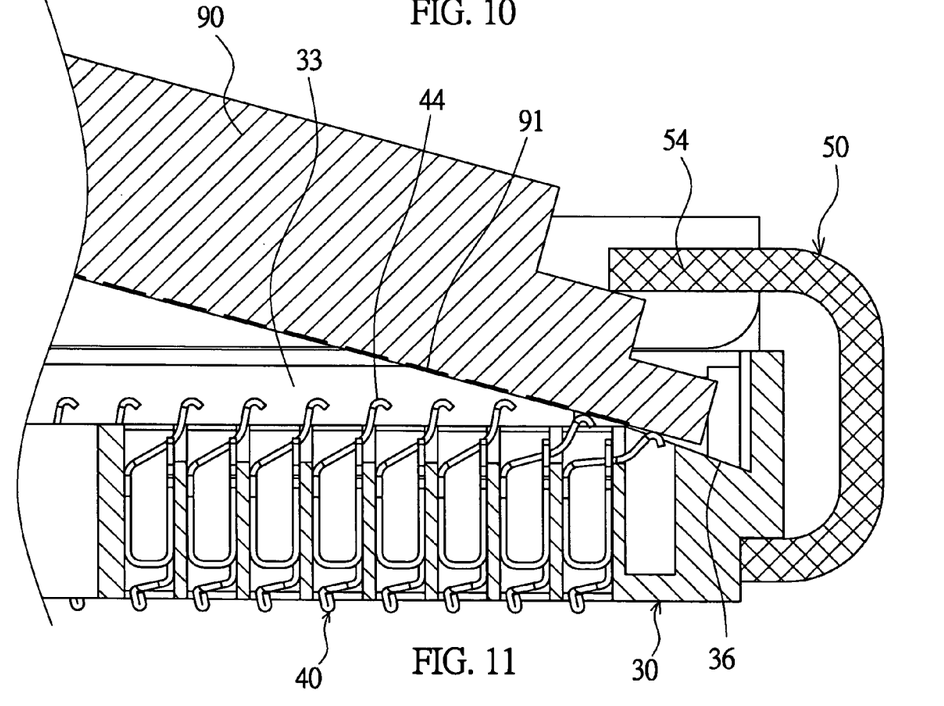
FIGS. 11 to 13 are cross-sectional side views showing the chip connector according to the first embodiment of the invention.
Figure 12:
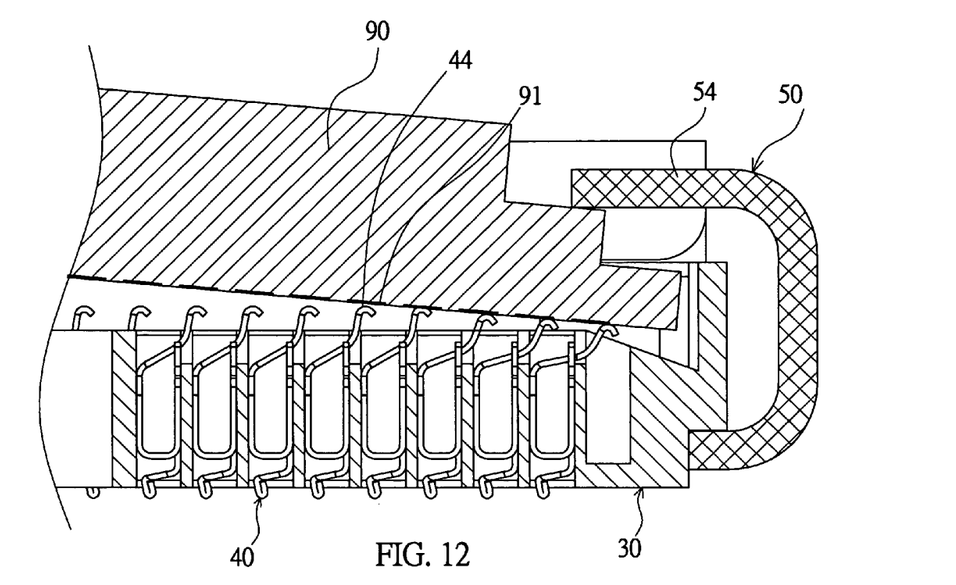
Figure 13:
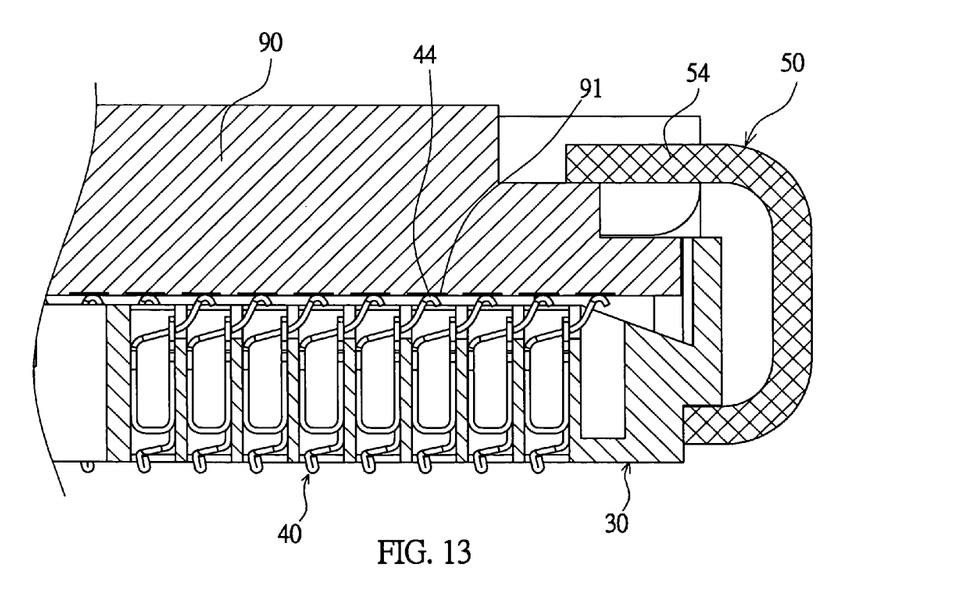
Figure 14:
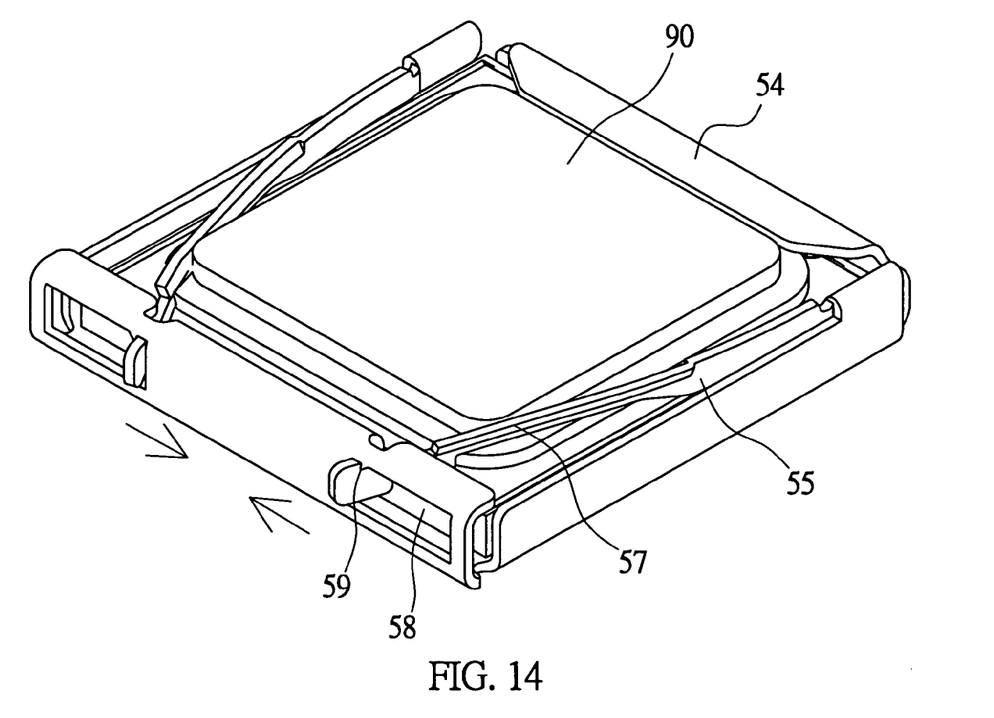
FIG. 14 is a pictorial view showing the usage state according to the first embodiment of the invention.

As shown in FIGS. 10 and 11, the front end of the chip 90 slantingly enters the bevel slot 36 at the front end of the placement area 33 and is positioned under the pressing board 54 of the outer seat 50. As shown in FIG. 12, the chip 90 is gradually pressed down. At this time, the chip 90 gradually becomes horizontal and presses the rear section 57 of the elastic arm portion 55 such that the two elastic arm portions 55 move outwards. As shown in FIGS. 13 and 14, when the chip 90 is pressed to the bottom such that the chip 90 becomes horizontal, the two elastic arm portions 55 rebound such that the rear sections 57 press the side edges longitudinally at the rear section of the chip 90. At this time, the front end of the chip 90 is pressed longitudinally by the pressing board 54 such that the chip 90 can be positioned stably, and the connection point 91 is in elastic contact with the connection point 44 of the terminal 40.

As shown in FIGS. 10 and 11, the front end of the chip 90 slantingly enters the bevel slot 36 at the front end of the placement area 33 and is positioned under the pressing board 54 of the outer seat 50. As shown in FIG. 12, the chip 90 is gradually pressed down. At this time, the chip 90 gradually becomes horizontal and presses the rear section 57 of the elastic arm portion 55 such that the two elastic arm portions 55 move outwards. As shown in FIGS. 13 and 14, when the chip 90 is pressed to the bottom such that the chip 90 becomes horizontal, the two elastic arm portions 55 rebound such that the rear sections 57 press the side edges longitudinally at the rear section of the chip 90. At this time, the front end of the chip 90 is pressed longitudinally by the pressing board 54 such that the chip 90 can be positioned stably, and the connection point 91 is in elastic contact with the connection point 44 of the terminal 40.

The elastic arm portions 55 of the embodiment can naturally touch the side edges of the rear section of the chip. If it is desired to further position the elastic arm portions 55, the two elastic arm portions 55 can be pressed inwards such that the front ends of the portions 55 move over the stopping projections 59 and are then positioned at inner portions of the through holes 58. Thus, it is possible to further prevent the elastic arm portions 55 from moving outwards by the stopping projections 59.

When the chip 90 is to be taken out, the two elastic arm portions 55 are slightly pressed down or longitudinally to part from the stopping projections 59 and then elastically moved outwards or elastically moved laterally. Then, the elastic arm portions 55 do not press the side edge of the rear section of the chip 90, and the chip 90 rebounds so that the user can take the chip out.

The connector of the invention has the following advantages.

1. The structure is simple because the outer seat 50 is a single member and does not have to be composed of the base 11, the upper cover 14 and the lever 16 in the prior art. So, the manufacturing cost can be decreased.

2. The operation is simple because the user only has to slantingly insert one end of the chip 90 into a space under the pressing board 54 of the outer seat 50, and then to press the other end of the chip 90 such that the two elastic arm portions 55 move outwards and then rebound to press the other ends of the chip. So, the user can easily perform the operation using only one hand.

3. As shown in FIGS. 11 to 13, because the chip 90 is slantingly inserted and then pressed down to rotate into a horizontal state, the chip 90 is slightly moved when the chip 90 is pressed down. The slight movement can make the connection point 91 of the chip 90 in sliding contact with the connection point 44 of the terminal 40, and the oxide layers of the two connection points can be scraped off.

Figure 15:
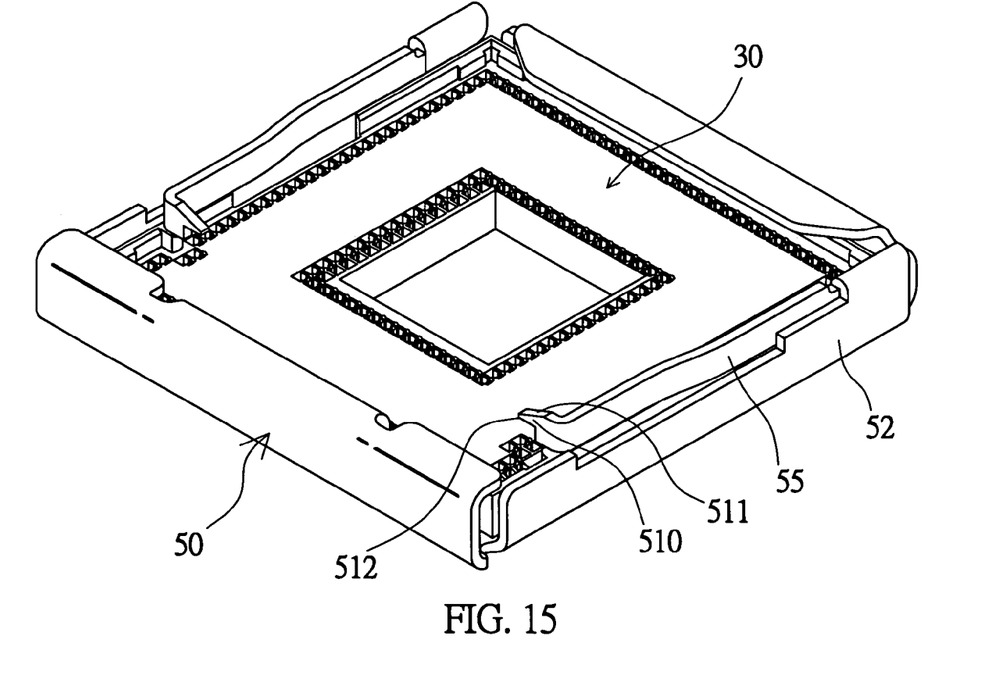
FIG. 15 is a pictorially assembled view showing a chip connector according to a second embodiment of the invention.

As shown in FIG. 15, the second embodiment is almost the same as the first embodiment except that the rear sections of the elastic arm portions 55 of the outer seat do not extend into the inner seat 30 slantingly. The front ends of the elastic arm portions 55 are connected to an upper edge of the front end of the circumferential wall 52 at two sides of the outer seat 50. Each of the rear ends of the elastic arm portions 55 is formed with a hooking potion 510 extending toward the inner seat 30. The hooking potion 510 has a lead-in surface 511 that tilts downwards and an engaging surface 512 below the lead-in surface 511. The engaging surface 512 of the hooking potion 510 can press the side edge of the rear section of the chip.

Figure 16:
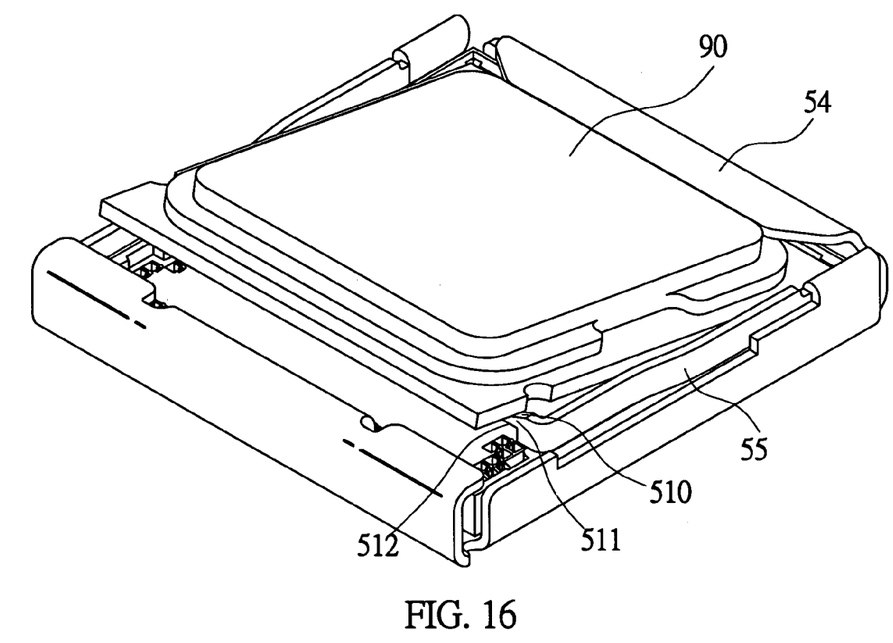
FIGS. 16 and 17 are pictorial views showing usage states of the chip connector according to the second embodiment of the invention.
Figure 17:
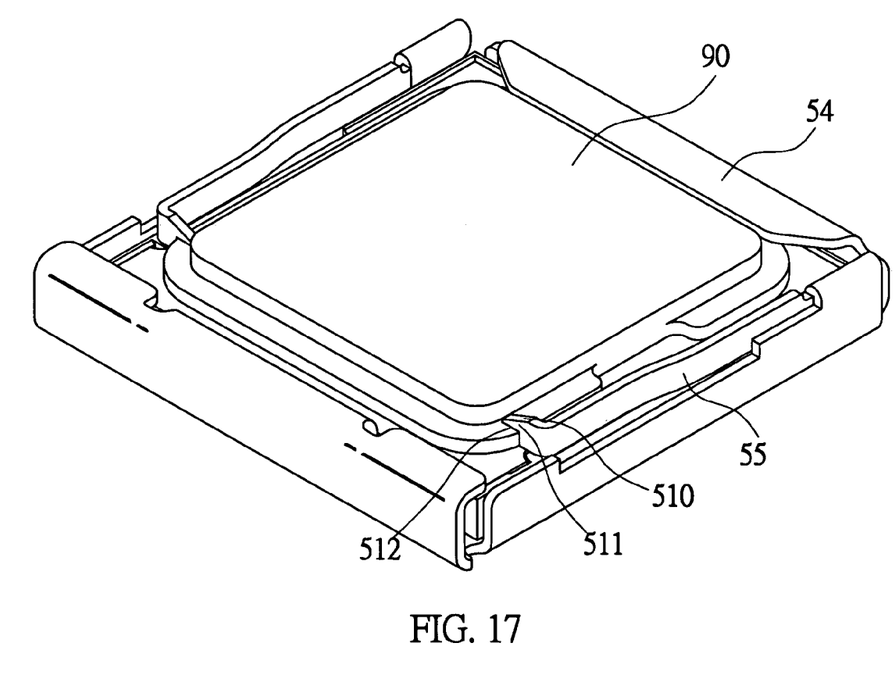

As shown in FIG. 16, the front end of the chip 90 slantingly enters the space under the pressing board 54 at the front end of the outer seat 50, and the side edges of the rear section of the chip rest on the lead-in surfaces 511 of the hooking potions of the two elastic arm portions 55. As shown in FIG. 17, the chip 90 is pressed down. At this time, the side edges of the rear section of the chip 90 press the elastic arm portions 55 to move toward the outside of the outer seat 50 along the lead-in surfaces 511. When the chip 90 is rotated into the horizontal state and positioned, the elastic arm portions 55 rebound to press the side edges of the rear section of the chip 90. At this time, the front end of the chip 90 is pressed by the pressing board 54, and the chip 90 can be positioned stably.

Although the rear end of the outer seat 50 of the embodiment does not have the through holes 58 to prevent the elastic arm portions 55 from moving upwards, the elastic arm portions 55 are shorter and have a smaller displacement. The rigidity of the elastic arm portion is very high, so the chip 90 still can be pressed sufficiently, and the arm portion is free from moving upwards.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip connector to be electrically connected to a chip, the chip connector comprising:
    an inner seat formed with a plurality of terminal slots spaced apart from one another, the inner seat having a top formed with a placement area in which the chip is placed;
    a plurality of terminals respectively disposed in the terminal slots of the inner seat, each of the terminals having an elastic arm, which has a connection point to be electrically connected to the chip; and
    an outer seat having a bottom surface, a circumferential wall for enclosing the inner seat, a front end formed with a stationary pressing board for pressing a front end of the chip, and two elastic arm portions extending backwards and formed at two sides of the outer seat, wherein the elastic arm portions press the chip and are elastically moved laterally to part from the chip, each of the elastic arm portions of the outer seat has a front section and a rear section, the front sections are connected to the two sides of the outer seat, and the rear section and the front section define an angle such that the rear section extends into the inner seat slantingly.

2. The chip connector according to claim 1, wherein a middle of the bottom surface of the outer seat is formed with an opening corresponding to the terminal slots of the inner seat.

3. The chip connector according to claim 1, wherein a periphery of the top of the inner seat is formed with a flange, which encloses the placement area.

4. The chip connector according to claim 1, wherein a front end of the placement area of the inner seat is formed with a concave bevel slot so that the chip can be slantingly placed into the placement area easily.

5. The chip connector according to claim 1, wherein the circumferential wall at a rear end of the outer seat is formed with two through holes, the elastic arm portions respectively pass through the through holes so as to restrict the elastic arm portions in lateral movements without upward movements.

6. The chip connector according to claim 5, wherein a stopping projection for preventing the elastic arm portions from moving outwards is formed in the through hole.

7. A chip connector to be electrically connected to a chip, the chip connector comprising:
    an inner seat brined with a plurality of terminal slots spaced apart from one another, the inner seat having a top formed with a placement area in which the chip is placed;
    a plurality of terminals respectively disposed in the terminal slots of the inner seat, each of the terminals having an elastic arm, which has a connection point to be electrically connected to the chip; and
    an outer seat having a bottom surface, a circumferential wall for enclosing the inner seat, a front end formed with a stationary pressing board for pressing a front end of the chip, and two elastic arm portions extending backwards and formed at two sides of the outer seat, wherein the elastic arm portions press the chip and are elastically moved laterally to part from the chip, two front ends of the elastic arm portions are connected to the two sides of the outer seat, two hooking potions extending toward the inner seat are formed near rear ends of the elastic arm portions, each of the hooking potions has a lead-in surface that tilts downwards and an engaging surface below the lead-in surface, and the engaging surfaces of the hooking potions press side edges of a rear section of the chip.

8. The chip connector according to claim 7, wherein a middle of the bottom surface of the outer seat is formed with an opening corresponding to the terminal slots of the inner seat.

9. The chip connector according to claim 7, wherein a periphery of the top of the inner seat is formed with a flange, which encloses the placement area.

10. The chip connector according to claim 7, wherein a front end of the placement area of the inner seat is formed with a concave bevel slot so that the chip can be slantingly placed into the placement area easily.

* * * * *